(12) United States Patent
Cheng et al.

(10) Patent No.: US 11,887,979 B2
(45) Date of Patent: Jan. 30, 2024

(54) TRANSIENT VOLTAGE SUPPRESSION DEVICE AND MANUFACTURING METHOD THEREFOR

(71) Applicant: CSMC TECHNOLOGIES FAB2 CO., LTD., Wuxi (CN)

(72) Inventors: Shikang Cheng, Wuxi (CN); Yan Gu, Wuxi (CN); Sen Zhang, Wuxi (CN)

(73) Assignee: CSMC TECHNOLOGIES FAB2 CO., LTD., Wuxi (CN)

( * ) Notice: Subject to any disclaimer, the term of this patent is extended or adjusted under 35 U.S.C. 154(b) by 44 days.

(21) Appl. No.: 17/267,835

(22) PCT Filed: Aug. 15, 2019

(86) PCT No.: PCT/CN2019/100717
§ 371 (c)(1),
(2) Date: Feb. 11, 2021

(87) PCT Pub. No.: WO2020/042915
PCT Pub. Date: Mar. 5, 2020

(65) Prior Publication Data
US 2021/0249403 A1 Aug. 12, 2021

(30) Foreign Application Priority Data
Aug. 31, 2018 (CN) .......................... 201811012572.6

(51) Int. Cl.
*H01L 27/02* (2006.01)
*H01L 29/66* (2006.01)
*H01L 29/866* (2006.01)

(52) U.S. Cl.
CPC ...... *H01L 27/0255* (2013.01); *H01L 27/0262* (2013.01); *H01L 27/0296* (2013.01); *H01L 29/66106* (2013.01); *H01L 29/866* (2013.01)

(58) Field of Classification Search
CPC ... H01L 29/866; H01L 29/868; H01L 29/861; H01L 29/872; H01L 29/8725;
(Continued)

(56) References Cited

U.S. PATENT DOCUMENTS 6,822,295 B2    11/2004  Larson
7,196,889 B2 *  3/2007   Gerrish ............... H01L 27/0255
                                                         361/91.1
(Continued)

FOREIGN PATENT DOCUMENTS

CN    102856323 A    1/2013
CN    104347621 A    2/2015
CN    104392989 A    3/2015

OTHER PUBLICATIONS

International Search Report for PCT/CN2019/100717, dated Nov. 18, 2019, 5 pages.

*Primary Examiner* — Natalia A Gondarenko
(74) *Attorney, Agent, or Firm* — Dority & Manning, PA (57) ABSTRACT

A transient voltage suppression device and a manufacturing method therefor, the transient voltage suppression device including: a substrate, a first conductivity type well region and a second conductivity type well region disposed in the substrate. The first conductivity type well region includes a first well, a second well, and a third well. The second conductivity type well region includes a fourth well that isolates the first well from the second well, and a fifth well that isolates the second well from the third well. The device further includes a Zener diode well region provided in the first well, a first doped region provided in the Zener diode well region, a second doped region provided in the Zener diode well region, a third doped region provided in the second well, a fourth doped region provided in the third well, and a fifth doped region provided in the third well.

15 Claims, 4 Drawing Sheets

(58) Field of Classification Search
CPC .............. H01L 29/0649; H01L 29/0692; H01L 29/6606; H01L 29/66068; H01L 29/417; H01L 29/66098; H01L 29/66106; H01L 29/882; H01L 29/885; H01L 29/66121; H01L 29/66136; H01L 29/66143; H01L 29/404; H01L 29/407; H01L 29/66151; H01L 29/66219; H01L 29/66363; H01L 29/66371; H01L 29/66386; H01L 29/66393; H01L 29/66413; H01L 29/66212; H01L 29/7811; H01L 27/02; H01L 27/0248; H01L 27/0255; H01L 27/0262; H01L 27/0292; H01L 27/0296; H01L 27/0811; H01L 27/0814; H01L 27/0817; H01L 27/1463; H01L 29/87; H01L 29/0646; H01L 29/0688
USPC ....... 257/355, 143–146, 173, 622, 625, 618, 257/332, 328, 603, 619, 620, 623

See application file for complete search history.

(56) References Cited

U.S. PATENT DOCUMENTS

| | | | |
|---|---|---|---|
| 8,218,276 | B2 | 7/2012 | Mallikarjunaswamy |
| 8,503,141 | B2 | 8/2013 | Mallikarjunaswamy |
| 8,542,470 | B2* | 9/2013 | Mallikarjunaswamy ................... H01L 29/87 361/56 |
| 8,723,264 | B2 | 5/2014 | Marreiro et al. |
| 10,263,417 | B2 | 4/2019 | Chen |
| 2010/0320501 | A1* | 12/2010 | Gendron ................. H01L 29/87 257/E21.369 |
| 2012/0281329 | A1* | 11/2012 | Mallikarjunaswamy ................... H01L 29/7436 361/111 |
| 2017/0077082 | A1* | 3/2017 | Marreiro ............. H01L 27/0255 |
| 2017/0244244 | A1* | 8/2017 | Ikeda .................... H01L 29/744 |
| 2018/0033878 | A1* | 2/2018 | Tailliet ................ H01L 29/7412 |
| 2018/0090477 | A1* | 3/2018 | Yin ..................... H01L 27/0255 |

* cited by examiner

TRANSIENT VOLTAGE SUPPRESSION DEVICE AND MANUFACTURING METHOD THEREFOR

CROSS-REFERENCE TO RELATED APPLICATIONS

This application is a National Stage of International Application No. PCT/CN2019/100717, filed on Aug. 15, 2019, which claims priority to Chinese Patent Application No. 201811012572.6, filed on Aug. 31, 2018. Both of the aforementioned applications are hereby incorporated by reference in their entireties.

TECHNICAL FIELD

The present disclosure relates to the field of semiconductor manufacturing, particularly to a transient voltage suppression device, and to a method for manufacturing a transient voltage suppression device.

BACKGROUND

Unexpected voltage transients and surges are often encountered in the whole machine and system, causing semiconductor devices in the whole machine and system to be burned or broken down, thereby resulting in damage to the whole machine and system. Therefore, TVS (transient voltage suppressors), as a highly effective protection device with PN junction, are widely used for various I/O interfaces due to their rapid response and high resistance against the ESD. Currently, the transmission speed of high-speed interfaces, represented by HDMI (high definition multimedia interface), becomes faster and faster, even up to 5 Gbps. In order to ensure the completeness of data, the requirements for capacitors against ESD arranged at interfaces are extremely strict. In addition, there are up to hundreds of pins in a practical drive chip. Each of the pins is threated by ESD. Protecting the I/O interfaces as many as possible without taking up a large area puts forward higher requirements for the integration of TVS.

SUMMARY

In view of above, it is necessary to provide a transient voltage suppression device having a new structure, and a method for manufacturing the same.

A transient voltage suppression device is provided, including a substrate being of a second conductivity type; a first conductivity type well region disposed in the substrate and including a first well, a second well, and a third well; a second conductivity type well region disposed in the substrate and including a fourth well and a fifth well, the fourth well being disposed between the first well and the second well to isolate the first well and the second well from each other, the fifth well being disposed between the second well and the third well to isolate the second well and the third well from each other, the first conductivity type and the second conductivity type being conductivity types opposite to each other; a Zener diode well region being of the second conductivity type and disposed in the first well; a first doped region being of the first conductivity type and disposed in the Zener diode well region; a second doped region being of the second conductivity type and disposed in the Zener diode well region; a third doped region being of the first conductivity type and disposed in the second well; a fourth doped region being of the first conductivity type and disposed in the third well; and a fifth doped region being of the second conductivity type and disposed in the third well. The third doped region, the second well, the fourth well, the first well, the Zener diode well region, and the second doped region constitute a silicon-controlled rectifier. The second doped region is used as an anode region of the silicon-controlled rectifier. The third doped region is used as a cathode region of the silicon-controlled rectifier. The second doped region is used as a first potential terminal. The first doped region is used as a cathode of a Zener diode, and the Zener diode well region is used as an anode of the Zener diode. The fifth doped region is used as an anode of a diode, and the fourth doped region is used as a cathode of the diode. The fifth doped region and the third doped region are connected to each other and are used as a second potential terminal. The fourth doped region is electrically connected to the first doped region.

A method for manufacturing a transient voltage suppression device, the transient voltage suppression device including a diode, a Zener diode, and a silicon-controlled rectifier, an anode region of the silicon-controlled rectifier being used as a first potential terminal, a cathode region of the diode and a cathode region of the silicon-controlled rectifier being electrically connected to each other and being used as a second potential terminal, the cathode region of the diode being electrically connected to a cathode region of the Zener diode. The method includes: forming a mask layer on a substrate of a second conductivity type, and then performing a lithography and etching the mask layer to expose a doping window of a first conductivity type well region; doping the substrate with first conductivity type ions through the doping window of the first conductivity type well region to form a first region on a surface of the substrate; growing an oxide layer as a doping blocking layer in the first region; removing the mask layer, and doping areas of the surface of the substrate not covered by the doping blocking layer with second conductivity type ions to form a second region, the first conductivity type and the second conductivity type being conductivity types opposite to each other; performing a thermal drive-in, so that that a first diffusion occurs in the first region to form a first well, a second well, and a third well, and a second diffusion occurs in the second region to form a fourth well and a fifth well, the fifth well being disposed between the first well and the second well to isolate the first well and the second well from each other, the fifth well being disposed between the second well and the third well to isolate the second well and the third well from each other; forming, by lithographing and doping with second conductivity type ions, a Zener diode well region in the first well after the doping blocking layer is removed; forming, by lithographing and doping, respectively a first doped region, a second doped region, a third doped region, a fourth doped region, and a fifth doped region. The first doped region is of the first conductivity type and is disposed in the Zener diode well region. The second doped region is of the second conductivity type and is disposed in the Zener diode well region. The third doped region is of the first conductivity type and is disposed in the second well. The fourth doped region is of the first conductivity type and is disposed in the third well. The fifth doped region is of the second conductivity type and is disposed in the third well.

One or more embodiments of the present disclosure will be described in detail in the following figures and description. Other features, objects and advantages of this application will become more apparent from the description, drawings and claims.

BRIEF DESCRIPTION OF THE DRAWINGS

In order to better describe and illustrate the embodiments and/or examples of the inventions disclosed herein, one or more figures can be referred to. The additional details or examples for illustrating the drawings should not be deemed as limiting the scope of any of the disclosed inventions, the currently described embodiments and/or examples, and the best mode of the inventions currently understood.

DETAILED DESCRIPTION OF THE EMBODIMENTS

The semiconductor terms used herein are the technical terms commonly used by those skilled in the art. For example, for P-type impurities and N-type impurities, it is simply to use P+ to represent P-type with heavily doping concentration, P to represent P-type with medium doping concentration, P− to represent P-type with lightly doping concentration, N+ to represent N-type with heavily doping concentration, N to represent N-type with medium doping concentration, and N− to represent N-type with lightly doping concentration.

A conventional TVS consistent of a single avalanche diode has a comparably large capacitance, which is generally at least dozens of picofarads. The capacitance value increases proportionally as the increase of the capability of the ESD. A high capacitance value for high-speed interfaces will critically affect the integrity of data. The solution is generally to connect a diode having a low capacitance with the avalanche diode of the TVS in series to realize a one-way TVS having a low capacitance. As exemplary TVS devices, in one of them, the diode having the low capacitance and the avalanche diode of the TVS are integrated on the same chip by means of being implanted into a buried layer and growing an epitaxy of high resistivity, which is, however, costly. In another one, the diodes are distributed on the surface of the chip using a conventional CMOS process.

Figure 1:
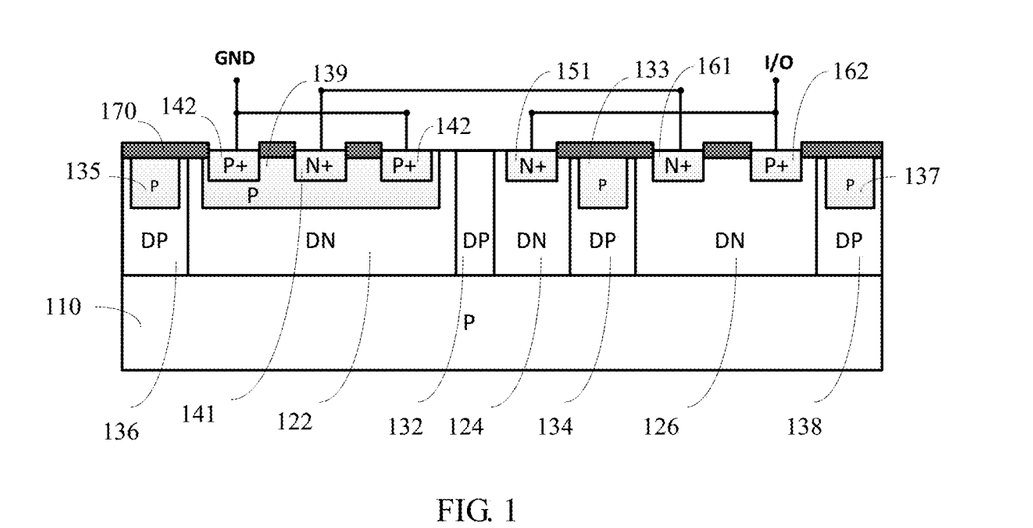
FIG. 1 is a structure diagram illustrating a transient voltage suppression device according to an embodiment.

FIG. 1 is a structure diagram illustrating a transient voltage suppression device according to an embodiment. The transient voltage suppression device includes a substrate region 110, a first conductivity type well region, a second conductivity type well region, a Zener diode well region 139, a first doped region 141, a second doped region 142, a third doped region 151, a fourth doped region 161, and a fifth doped region 162. The first conductivity type well region includes a first well 122, a second well 124, and a third well 126. The second conductivity type well region includes a fourth well 132 and a fifth well 134.

The substrate 110 is of the second conductivity type. The first conductivity type well region and the second conductivity type well region are disposed in the substrate 110. The Zener diode well region 139 is disposed in the first well 122 and is of the second conductivity type. The first doped region 141 is of the first conductivity type and is disposed in the Zener diode well region 139. The second doped region 142 is of the second conductivity type and is disposed in the Zener diode well region 139. The third doped region 151 is of the first conductivity types and is disposed in the second well 124. The fourth doped region 161 is of the first conductivity type and is disposed in the third well 126. The fifth doped region 162 is of the second conductivity type and is disposed in the third well 126. In the embodiment shown in FIG. 1, the first conductivity type is N-type, the second conductivity type is P-type, the substrate 110 is a P-type substrate, the first conductivity type well region is an N-type well, and the second conductivity type well region is a P-type well. In other embodiments, it is also possible that the first conductivity type is P-type, and the second conductivity type is N-type.

Figure 2:
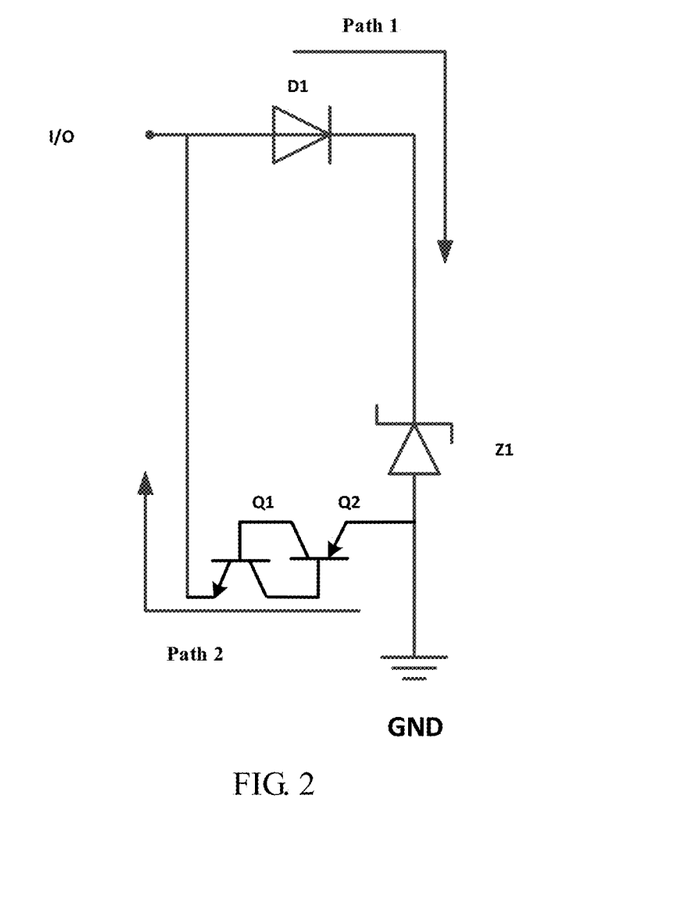
FIG. 2 is a principle schematic diagram illustrating an equivalent circuit to the transient voltage suppression device of FIG. 1.

FIG. 1 is a schematic diagram of an equivalent connection of the transient voltage suppression device, showing that doped areas are electrically connected through metal interconnection wires (a dot at the intersection of the wires means presence of a connection, no dot means absence of a connection). Referring to FIG. 2 together, the third doped region 151, the second well 124, the fourth well 132, the first well 122, the Zener diode well region 139, and the second doped region 142 constitute a silicon-controlled rectifier (SCR). The second doped region 142 is used as an anode region of the silicon-controlled rectifier. The third doped region 151 is used as a cathode region of the silicon-controlled rectifier. The second doped region 142 is used as a first potential terminal to be connected to the ground (GND). The first doped region 141 is used as a cathode of a Zener diode Z1. The second doped region 142 is used as an anode of the Zener diode Z1. The fifth doped region 162 is used as an anode of the diode D1. The fourth doped region 161 is used as a cathode of the diode D1. The fifth doped region 162 and the third doped region 151 connect each other and are used as a second potential terminal to be electrically connected to an input/output terminal (I/O terminal). The fourth doped region 161 is electrically connected to the first doped region 141.

In the above transient voltage suppression device, the isolation between the first well 122 and the second well 124 by the fourth well 132 and the isolation between the second well 124 and the third well 126 by the fifth well 134 are equal to the isolation between the Zener diode Z1 and the silicon-controlled rectifier and the isolation between the diode D1 and the silicon-controlled rectifier, which has a good isolation effect, thereby avoiding the switch-on of a parasitic BJT. Therefore, the ESD has a strong robustness and is easily to be integrated. Moreover, since the current capability (the ability to leak large currents) of the silicon-controlled rectifier is stronger than that of an ordinary PIN diode, the use of a parasitic silicon-controlled rectifier can greatly improve the current capability of the negative pulse ESD.

In the embodiment shown in FIG. 1 and FIG. 2, the silicon-controlled rectifier includes a NPN transistor Q1 and a PNP transistor Q2. Specifically, the third doped region 151, the second well 124, the fourth well 132, and the first well 122 constitute the NPN transistor Q1. The second doped region 142, the Zener diode well region 139, and the fourth well 132 constitute the PNP transistor Q2.

Referring to FIG. 2, the above-mentioned transient voltage suppression device can realize the protection on paths (path 1 and path 2) from the input/output terminal I/O to the ground GND. When a positive instant pulse signal is input through the input/output terminal I/O, since the diode D1 is forwardly biased and the triggering voltage of the silicon-controlled rectifier is adjusted (the triggering voltage of the silicon-controlled rectifier is dependent on the width and the concentration of the fourth well between the NPN transistor Q1 and the PNP transistor Q2) to be greater than the stabilized voltage of the Zener diode Z1, the signal flows through the diode D1 first, then through the Zener diode Z1, and lastly flows to the ground GND. The voltage of the input/output terminal I/O is clamped at $V_{BR}$, where $V_{BR}=V_{D1}+V_{Z1}$. $V_{D1}$ denotes a forward voltage drop of the diode D1 that is about 0.6 to 0.7V at room temperature. $V_{Z1}$ denotes a reverse breakdown withstand voltage of the Zener diode Z1, different application ranges of which can be achieved by controlling the doping concentrations of the Zener diode well region 139 and the concentration of the first doped region. For a TVS product applied under a working voltage (VDD) of 5V, $V_{Z1}$ is generally limited to from 6V to 7V Therefore, the voltage at the input/output terminal I/O is clamped in a safe voltage range, which has a very good protection effect. When a negative instant pulse signal is input through the input/output terminal I/O, and the diode D1 is reversely biased, since the triggering voltage of the silicon-controlled rectifier is less than the reverse withstand voltage of the diode D1, the signal flows first through the silicon-controlled rectifier, and lastly flows to the ground GND.

In the embodiment shown in FIG. 1, the second conductivity type well region further includes a sixth well 136 and a seven well 138. The first well 122 is disposed between the fourth well 132 and the fifth well 136. The third well 126 is disposed between the seventh well 138 and the fifth well 134.

In an embodiment, the junction depth of the first conductivity type well region and the second conductivity type well region is from 7 micrometers to 15 micrometers.

In the embodiment shown in FIG. 1, the first conductivity type well region (that is, the first well 122 and the second well 124) is a deep N-well (DN), and the second conductivity type well region (that is, the third well 132, the fourth well 134, and the fifth well 136) is a deep P-well (DP). Since the well region is the deep well, when a voltage is applied at electrodes of the device, the spreading width of the depletion layer will be larger (larger than the spreading width of the depletion layer of a well having a smaller junction depth in the conventional transient voltage suppression device), which is equivalent to making the distance between the electrode plates larger. Therefore, the parasitic capacitance decreases. Further, in an embodiment, since the first conductivity type well region and the second conductivity type well region are formed by drive-in for a long time at high temperatures, the doping concentration is less than that of the well region of the conventional transient voltage suppression device, which is advantageous to further decrease the parasitic capacitance.

For a TVS product applied under a working voltage (VDD) of 5V, in an embodiment, the fourth well 132 has a width in a range from 5 micrometers to 10 micrometers (the width direction is the lateral direction of FIG. 1) and the doping concentration of the fourth well 132 is in a range from 1E14 cm$^{-3}$ to 1E15 cm$^{-3}$.

In the embodiment shown in FIG. 1, two second doped regions 142 are disposed in the first well 122 as the emitter region of the PNP transistor Q2.

In an embodiment, an isolation structure can be disposed between the structures in the active region, which need to be isolated from each other. In the embodiment shown in FIG. 1, an isolation structure 170 is disposed between the fourth doped region 161 and the fifth doped region 162 for isolation, and an isolation structure 170 is disposed between the third doped region 151 and the fourth doped region 161 for isolation. Moreover, the upper surfaces of the sixths well 136 and the seventh well 138 are both provided with isolation structures 170.

In an embodiment, the isolation structure is made of an oxide insulating material, for example, oxide silicon. In an embodiment, the isolation structure 170 is a LOCOS (local oxidation of silicon) structure.

In the embodiment of FIG. 1, the surface regions of the substrate 110, other than the doped regions and the region between the right second doped region 142 and the third doped region 151, are provided with isolated structures 170.

In an embodiment, the second conductivity type well region is formed in the areas of the surface of the substrate 110 except the area where the first conductivity type well region is located.

In an embodiment, the transient voltage suppression device further includes an enhancing well 133, which is of the second conductivity type and is disposed in the fifth well 134. In the embodiment shown in FIG. 1, the sixth well 136 is also provided with an enhancing well 135, and the seventh well 137 is also provided with an enhancing well 137. The enhancing wells arranged in the second conductivity type well regions for isolation can enhance the threshold voltage of the surface field, which further reduces the leakage current between the components isolated from each other by the second conductivity type well region.

Figure 5:
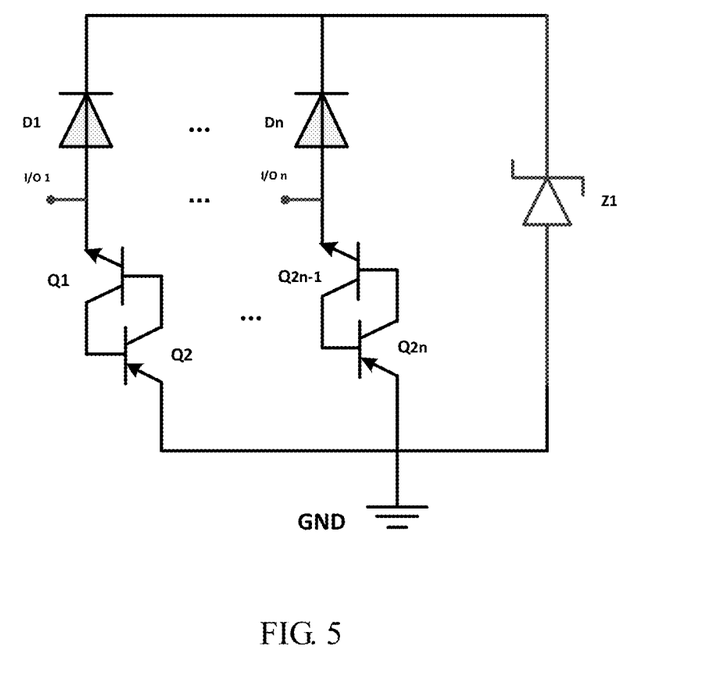
FIG. 5 is a principle schematic diagram illustrating an equivalent circuit to the transient voltage suppression device according to another embodiment.

In an embodiment, referring to FIG. 5, it is possible to integrate n (n≥1) diodes and n silicon-controlled rectifiers in the transient voltage suppression device to provide the ESD protection for n input/output terminals I/O. Each diode is connected to one silicon-controlled rectifier as being a branch, and each input/output terminal I/O is connected to such a branch. Since it is necessary to avoid signal crosstalk between the input/output terminals I/O, the isolation withstand voltage between the input/output terminals I/O should be greater than the actual working voltage of the input/output terminals I/O.

Therefore, in an embodiment, the transient voltage suppression device includes n silicon-controlled rectifiers and n diodes, where n is an integer greater than or equal to 1. Each silicon-controlled rectifier is connected to a diode to form a branch. Each branch is adapted to be connected to an input/output terminal I/O. The branches are isolated from each other through the second conductivity type well region.

Figure 3:
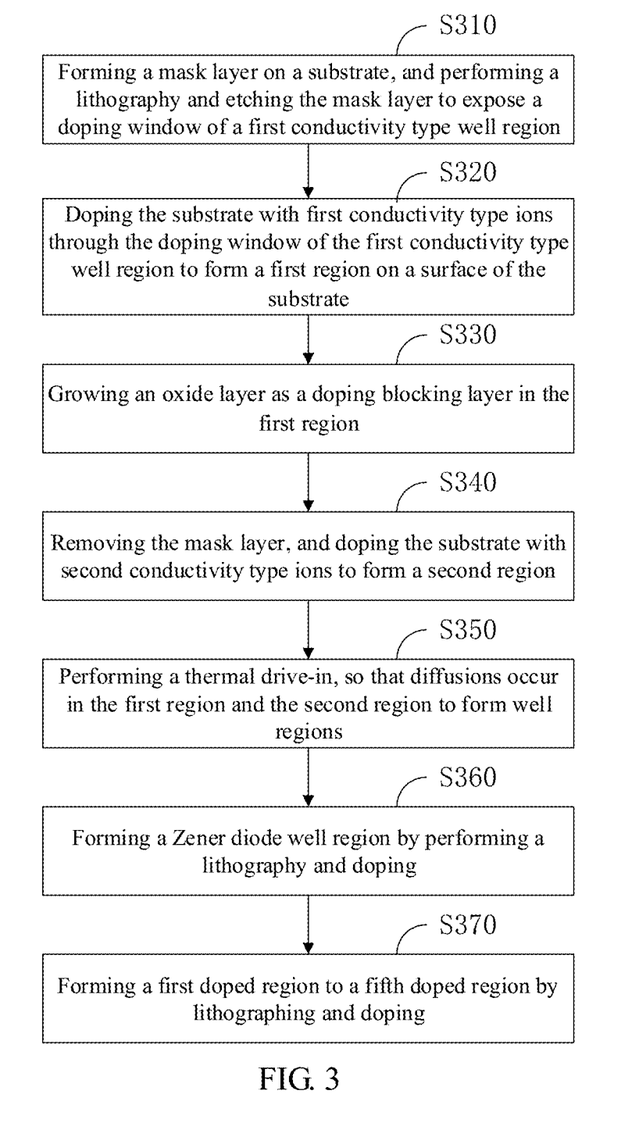
FIG. 3 is a flow chart of a method for manufacturing a transient voltage suppression device according to an embodiment.

FIG. 3 is a flow chart of a method for manufacturing a transient voltage suppression device according to an embodiment. The method includes following steps.

At step S310, a mask layer is formed on a substrate, and a lithography is performed and the mask layer is etched to expose a doping window of a first conductivity type well region.

After the mask layer is formed on the substrate, a surface of the mask layer is coated with a photoresist. Then, the photoresist is exposed and developed to form a pattern of the doping window of the first conductivity type well region. Next, the mask layer not covered by the photoresist is etched off to expose the doping window of the first conductivity type well region. In the embodiment shown in FIG. 1, the mask layer is a hard mask 182. In an embodiment, the hard mask 182 can be a silicon nitride layer. In the embodiment shown in FIG. 1, before the hard mask 182 is formed, a sacrificial oxide layer 171 can also be formed on the surface of the substrate 110. It also needs to remove the sacrificial oxide layer 171 in corresponding areas when etching at step S310. In an embodiment, the hard mask 182 can be formed by depositing silicon nitride, and the sacrificial oxide layer 171 can be formed by thermally growing an oxide layer.

In an embodiment, the substrate 110 is a semiconductor substrate. The material of the substrate 110 can be undoped monocrystalline silicon, monocrystalline silicon doped with impurities, silicon on insulator (SOI), stacked-silicon on insulator (SSOI), stacked-silicon-germanium on insulator (S—SiGeOI), silicon germanium on insulator (SiGeOI), germanium on insulator (GeOI), and the like.

At step S320, the substrate is doped with first conductivity type ions through the doping window to form a first region on the surface of the substrate.

Figure 4A:
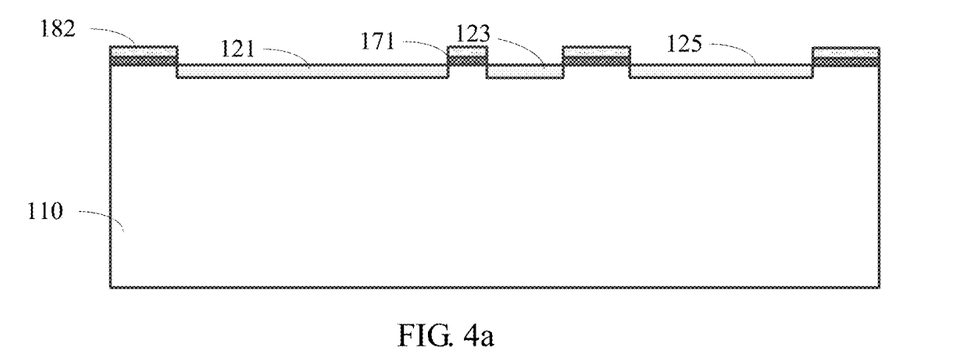
FIG. 4a to 4c are section diagrams of the transient voltage suppression device being manufactured using the method of FIG. 3 during a manufacturing process.

In this embodiment, the first region (including a region 121, a region 123, and a region 125) is formed on the surface of the substrate by an ion-implantation process to implant ions of N-type impurities, as shown in FIG. 4a.

At step 330, an oxide layer is grown in the first region, serving as a doping blocking layer.

In this embodiment, the oxide layer grows on the surface of the substrate 110 after the photoresist is removed. Since the regions excluding the doping window of the first conductivity type well region are covered by the mask layer (which is hardly to be oxidized), the doping blocking layer can only be formed in the doping window of the first conductivity type well region.

At step S340, the mask layer is removed, and the substrate is doped with second conductivity type ions to form a second region.

Figure 4B:
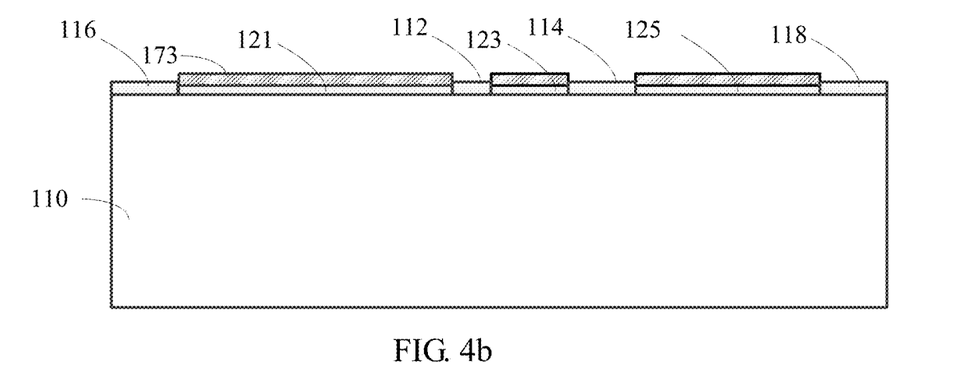

In this embodiment, ions of P-type impurities are implanted by an ion-implantation process after the mask layer is removed. Referring to FIG. 4b, since the doping blocking layer 173 is formed at the doping window of the first conductivity type well region, the second region (including a region 116, a region 112, a region 114, and a region 118) can only be formed in the areas except the first region. It can be understood that, in other embodiments, the first region can also be formed by implanting P-type ions, and the second region can be formed correspondingly by implanting N-type ions.

At step S350, a thermal drive-in is performed, so that diffusions occur in the first region and the second region to form well regions.

Figure 4C:
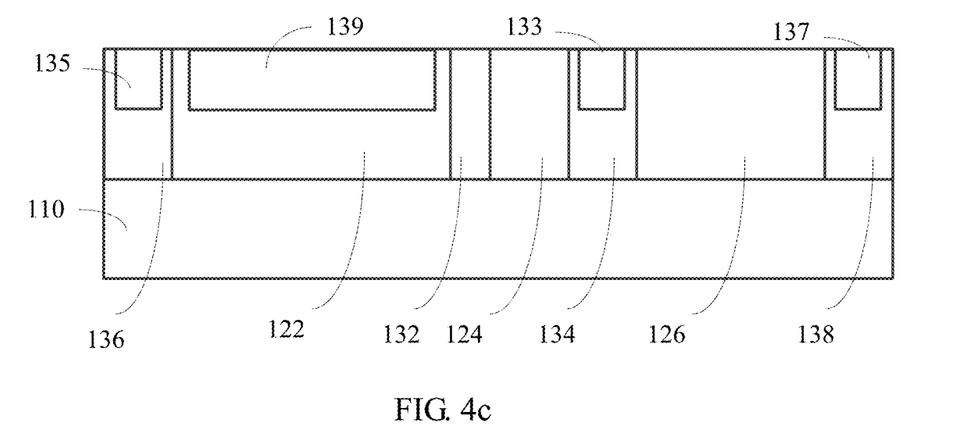

In this embodiment, by a driving-in at high temperature, diffusion occurs in the region 121 to form a first well 122, diffusion occurs in the region 123 to form a second well 124, diffusion occurs in the region 125 to form a third well 126, diffusion occurs in the region 112 to form a fourth well 132, diffusion occurs in the region 114 diffuses to form a fifth well 134, diffusion occurs in the region 116 to form a sixth well 136, and diffusion occurs in the region 118 to form the seventh well 138.

In an embodiment, the temperature of the thermal drive-in is from 1000 to 1300 degree Celsius, and the lasting time is from 250 to 350 minutes. Due to the high temperature and the long lasting time, the obtained well regions have deeper depths and lower doping concentrations. Since the spreading width of the depletion layer, when a voltage is applied to the electrodes of the device, becomes larger, which is equivalent to increasing the distance between the electrode plates, the parasitic capacitance thus decreases. In an embodiment, an amount of the ion-implantation at step S340 is slightly larger than an amount of the ion-implantation at step S320. Further, the amount of the ion-implantation at step S320 and step S340 is from $5E11$ cm$^{-2}$ to $5E12$ cm$^{-2}$.

At step 360, a Zener diode well region is formed by lithographing and doping.

In this embodiment, the second conductivity type ions are implanted by lithographing and an ion-implantation after the doping blocking layer is removed (in this embodiment, the doping blocking layer 173 is removed prior to the thermal drive-in), and a thermal drive-in is performed again, thereby forming the Zener diode well region in the first well. In this embodiment, at step S360, it is also necessary to form an enhancing well 133 in the fifth well 134, form an enhancing well 135 in the sixth well 136, and form an enhancing well 137 in the seventh well 138. Therefore, when performing the lithography at step S360, it is also required to expose implantation windows of the enhancing wells. In an embodiment, an amount of the implanted second conductivity type ion at step S360 is from $1E14$ cm$^{-2}$ to $1E15$ cm$^{-2}$. The temperature of the thermal drive-in is from 1000 to 1300 degree Celsius, and the lasting time is from 60 to 120 minutes. The enhancing wells can enhance the threshold voltage of the surface field, thereby further reducing the leakage current between the components isolated from each other by the second conductivity type well region.

At step S370, a first doped region to a fifth doped region are formed by lithographing and doping.

By lithographing and doping, a first doped region 141, a second doped region 142, a third doped region 151, a fourth doped region 161, and a fifth doped region 162 are respectively formed. In this embodiment, the first doped region 141, the third doped region 151, and the fourth doped region 161 are N-type doped regions, and the second doped region 142 and the fifth doped region 162 are P-type doped regions. In this embodiment, the N-type doped regions are formed first, then the P-type doped regions are formed, and then the Zener diode active region 139 is formed.

In an embodiment, a step that forms isolation structures is further included between step S360 and step S370. Specifically, the isolation structures 170 can be formed by a LOCOS process after lithographing, as shown in FIG. 1.

In an embodiment, the photoresist is removed after the isolation structures 170 are formed. Then, a first implantation photomask is used for lithographing to expose the areas in which the N-type doped regions are to be formed by implantation. The N-type ions are implanted to form the N-type doped regions. Next, the photoresist is removed. Then, a second implantation photomask is used for lithographing to expose the areas in which the P-type doped regions are to be formed by implantation. The P-type ions are implanted to form the P-type doped regions.

In an embodiment, after step S360, the method further includes following steps.

A dielectric layer is formed. Specifically, an interlayer dielectric (ILD) can be formed by using a deposition process.

A contact via is formed, and a conductive material is filled into the contact via. Specifically, the contact via can be formed by etching the dielectric layer after lithographing. The conductive material can be any suitable conductive material well known to those skilled in the art, including but not limited to metal. The metal can include one or more of Ag, Au, Cu, Pd, Pt, Cr, Mo, Ti, Ta, W and Al. In an embodiment, the dielectric layer is etched by a dry-etching process.

Metal interconnecting-wires are formed on the dielectric layer. Specifically, a lithography can be performed and the metal layer can be etched after the deposition of the metal layer to form the metal interconnecting-wires. In an embodiment, the deposited metal layer has a thickness of 3 micrometers. In an embodiment, the metal layer is etched by a dry-etching process.

In an embodiment, after the metal interconnecting-wires are formed, the method further includes a step of forming a passivation layer and a step of performing a lithography and etching the passivation layer to form a metal electrode contact.

In an embodiment, the interlayer dielectric can be an oxide silicon layer, including a doped or undoped material layer of oxide silicon, which is formed by a thermal chemical vapor deposition (thermal CVD) process or a high-density plasma process, for example, undoped silicon glass, phosphosilicate glass (PSG) or borophosphosilicate glass (BPSG). In addition, the interlayer dielectric can also be spin-on glass (SOG) doped with boron or doped with phosphorus, tetraethoxysilane (PTEOS) doped with phosphorus, or tetraethoxysilane (PTEOS) doped with boron.

In an embodiment, the deposited interlayer dielectric can also be planarized by a planarization method (for example, chemical mechanical polishing CMP), so that the interlayer dielectric has a planar surface.

In the above transient voltage suppression device, the isolation between the first well and the second well by the fourth well and the isolation between the second well and the third well are equal to the isolation between the Zener diode and the silicon-controlled rectifier and the isolation between the diode and the silicon-controlled rectifier, which has a good isolation effect, thereby avoiding the switch-on of the parasitic BJT. Therefore, the ESD has a strong robustness and is easily to be integrated. Moreover, since the current capability (the ability to leak larger currents) of the silicon-controlled rectifier is stronger than that of an ordinary PIN diode, the use of a parasitic silicon-controlled rectifier can greatly improve the current capability of the negative pulse ESD. Moreover, the N-type wells and the P-type wells are formed in the same drive-in, which can decrease the lateral size, thereby significantly decreasing the integration area of the TVS chip and effectively reducing the manufacturing costs.

In an embodiment, at step S320, arsenic ions having an implantation amount of $5E15$ $cm^{-2}$ and phosphorus ions having an implantation amount of $1E14$ $cm^{-2}$ are implanted.

In an embodiment, at step S340, boron difluoride having an implantation amount of $2.5E15$ $cm^{-2}$ is implanted.

In an embodiment, the doping blocking layer 173 is removed by a wet-etching process.

The above-mentioned embodiments only express a few implementations of the present disclosure, and the description is comparably specific and detailed, but it should not be interpreted as a limitation on the scope of the present disclosure. It should be pointed out that for those of ordinary skill in the art, without departing from the concept of the present disclosure, several modifications and improvements can be made, and these all fall within the protection scope of the present disclosure. Therefore, the protection scope of the disclosure should be subject to the appended claims.

What is claimed is:

1. A transient voltage suppression device, comprising:
a substrate, the substrate being of a second conductivity type;
a first conductivity type well region disposed in the substrate and comprising a first well, a second well, and a third well;
a second conductivity type well region disposed in the substrate and comprising a fourth well and a fifth well, the fourth well being disposed between the first well and the second well to isolate the first well and the second well from each other, the fifth well being disposed between the second well and the third well to isolate the second well and the third well from each other, the first conductivity type and the second conductivity type being conductivity types opposite to each other;
a Zener diode well region being of the second conductivity type and disposed in the first well such that the Zener diode well region is isolated from the substrate through the first well;
a first doped region being of the first conductivity type and disposed in the Zener diode well region;
a second doped region being of the second conductivity type and disposed in the Zener diode well region;
a third doped region being of the first conductivity type and disposed in the second well;
a fourth doped region being of the first conductivity type and disposed in the third well; and
a fifth doped region being of the second conductivity type and disposed in the third well; wherein the third doped region, the second well, the fourth well, the first well, the Zener diode well region, and the second doped region constitute a silicon-controlled rectifier, the second doped region being used as an anode region of the silicon-controlled rectifier, the third doped region being used as a cathode region of the silicon-controlled rectifier, the second doped region being used as a first potential terminal, the first doped region being used as a cathode of a Zener diode, the Zener diode well region is used as an anode of the Zener diode, the fifth doped region is used as an anode of a first diode, the fourth doped region is used as a cathode of the first diode, the fifth doped region and the third doped region being electrically connected to each other and being used as a second potential terminal, the fourth doped region being electrically connected to the first doped region, wherein the Zener diode and the first diode are connected in series, with the cathode region of the Zener diode connecting to the cathode of the first diode, the serially connected Zener diode and the first diode being connected with the silicon-controlled rectifier in parallel; and
wherein the first well, the fourth well, and the second well constitute a lateral NPN transistor of the silicon-controlled rectifier.

2. The transient voltage suppression device of claim 1, wherein the second potential terminal is adapted to be electrically connected to an input/output terminal, and the first potential terminal is adapted to be connected to ground.

3. The transient voltage suppression device of claim 1, wherein the first conductivity type well region and the second conductivity type well region have a junction depth in a range from 7 micrometers to 15 micrometers.

4. The transient voltage suppression device of claim 1, further comprising an enhancing well of the second conductivity type, the enhancing well being disposed in the fifth well.

5. The transient voltage suppression device of claim 1, wherein the first conductivity type is N-type, and the second conductivity type is P-type.

6. The transient voltage suppression device of claim 1, wherein the silicon-controlled rectifier further comprises a PNP transistor.

7. The transient voltage suppression device of claim 1, wherein the second conductivity type well region further comprises a sixth well and a seventh well, the first well being disposed between the fourth well and the sixth well, and the third well being disposed between the seventh well and the fifth well.

8. The transient voltage suppression device of claim 7, further comprising:
   a first isolation structure disposed between the fourth doped region and the fifth doped region and isolating the fourth doped region and the fifth doped region from each other;
   a second isolation structure disposed between the third doped region and the fourth doped region and isolating the third doped region and the fourth doped region from each other; and
   third isolation structures disposed on upper surfaces of the sixth well and the seventh well.

9. The transient voltage suppression device of claim 8, wherein the first, the second and the third isolation structures are made of an oxide insulating material.

10. A method for manufacturing a transient voltage suppression device according to claim 1, wherein the method comprises:
   forming a mask layer on the substrate of the second conductivity type, and then performing a lithography and etching the mask layer to expose a doping window of the first conductivity type well region;
   doping the substrate with first conductivity type ions through the doping window of the first conductivity type well region to form a first region on a surface of the substrate;
   growing an oxide layer as a doping blocking layer in the first region;
   removing the mask layer, and doping areas of the surface of the substrate not covered by the doping blocking layer with second conductivity type ions to form a second region;
   performing a thermal drive-in, so that a first diffusion occurs in the first region to form the first well, the second well, and the third well, and a second diffusion occurs in the second region to form the fourth well and the fifth well;
   forming, by lithographing and doping with the second conductivity type ions, the Zener diode well region in the first well after the doping blocking layer is removed; and
   forming, by lithographing and doping, respectively the first doped region, the second doped region, the third doped region, the fourth doped region, and the fifth doped region.

11. The method of claim 10, wherein a temperature of the thermal drive-in is in a range from 1000 to 1300 degrees Celsius, and a lasting time is in a range from 250 minutes to 350 minutes.

12. The method of claim 10, wherein the forming the mask layer on the substrate of the second conductivity type is forming a silicon nitride layer by deposition.

13. The method of claim 10, wherein the first conductivity type is N-type, and the second conductivity type is P-type, the step of forming, by lithographing and doping, respectively the first doped region, the second doped region, the third doped region, the fourth doped region, and the fifth doped region comprises:
   forming the first doped region, the third doped region, and the fourth doped region by lithographing using a first implantation photomask, and ion-implantation;
   forming the second doped region and the fifth doped region by lithographing using a second implantation photomask, and ion-implantation.

14. The method of claim 10, wherein after the step of forming the Zener diode well region in the first well and prior to the step of forming, by lithographing and doping, respectively the first doped region, the second doped region, the third doped region, the fourth doped region, and the fifth doped region, the method further comprises a step of forming isolation structures, the isolation structures are adapted to isolate the first doped region and the second doped region from each other, to isolate the third doped region and the fourth doped region from each other, and to isolate the fourth doped region and the fifth doped region from each other.

15. The method of claim 10, wherein the step of doping the substrate with the first conductivity type ions through the doping window of the first conductivity type well region to form the first region on the surface of the substrate comprises implanting arsenic ions having an ion-implantation amount of 5E15 $cm^{-2}$ and phosphorus ions having an ion-implantation amount of 1E14 $cm^{-2}$.

* * * * *